US009805791B2

(12) United States Patent
Yilmaz et al.

(10) Patent No.: US 9,805,791 B2
(45) Date of Patent: Oct. 31, 2017

(54) RESISTIVE MEMORY STRUCTURE FOR SINGLE OR MULTI-BIT DATA STORAGE

(71) Applicant: The Regents of the University of Michigan, Ann Arbor, MI (US)

(72) Inventors: Yalcin Yilmaz, Ann Arbor, MI (US); Pinaki Mazumder, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/653,203

(22) PCT Filed: Dec. 17, 2013

(86) PCT No.: PCT/US2013/075837
§ 371 (c)(1),
(2) Date: Jun. 17, 2015

(87) PCT Pub. No.: WO2014/100024
PCT Pub. Date: Jun. 26, 2014

(65) Prior Publication Data
US 2015/0332763 A1    Nov. 19, 2015

Related U.S. Application Data

(60) Provisional application No. 61/738,629, filed on Dec. 18, 2012.

(51) Int. Cl.
*G11C 11/00*    (2006.01)
*G11C 13/00*    (2006.01)
*G11C 11/56*    (2006.01)

(52) U.S. Cl.
CPC ...... *G11C 13/0064* (2013.01); *G11C 11/5685* (2013.01); *G11C 13/004* (2013.01);
(Continued)

(58) Field of Classification Search
CPC ............ G11C 13/0064; G11C 11/5685; G11C 13/0007
(Continued)

(56) References Cited

U.S. PATENT DOCUMENTS 7,864,597 B2 *    1/2011    Worley ............... G11C 5/145
365/189.09
2006/0023497 A1    2/2006    Kawazoe et al.
(Continued)

OTHER PUBLICATIONS

International Search Report and Written Opinion for application No. PCT/US2013/075837, dated Apr. 9, 2014, 8 pages.

*Primary Examiner* — Anthan Tran
(74) *Attorney, Agent, or Firm* — Reising Ethington P.C.

(57) ABSTRACT

A resistive memory structure comprises at least one resistive memory element configured to store one or more bits of data and a circuit electrically connected to the resistive memory element for use in performing at least one of a read or write operation on the at least one resistive memory element. The circuit includes a resistor electrically connected in series to the resistive memory element thereby forming a voltage divider and electrical node therebetween, and an interpretation circuit electrically connected to the electrical node formed between the resistive memory element and the resistor. The interpretation circuit is configured to interpret a voltage at the electrical node and to determine a resistive state of the resistive memory element based on the voltage at the electrical node.

24 Claims, 10 Drawing Sheets (52) U.S. Cl.
CPC ...... G11C 13/0007 (2013.01); G11C 13/0061 (2013.01); G11C 13/0069 (2013.01); G11C 13/0097 (2013.01)

(58) Field of Classification Search
USPC .......................................................... 365/148
See application file for complete search history.

(56) References Cited

U.S. PATENT DOCUMENTS

| | | |
|---|---|---|
| 2007/0247892 A1 | 10/2007 | Egerer |
| 2009/0163826 A1 | 6/2009 | Mouttet |
| 2009/0168504 A1 | 7/2009 | Lee et al. |
| 2010/0202185 A1* | 8/2010 | Katoh .................. G11C 13/00 365/148 |
| 2011/0242921 A1* | 10/2011 | Tran ...................... G11C 7/062 365/210.1 |
| 2011/0305066 A1 | 12/2011 | Nazarian et al. |

* cited by examiner

RESISTIVE MEMORY STRUCTURE FOR SINGLE OR MULTI-BIT DATA STORAGE

TECHNICAL FIELD

The present disclosure relates generally to electronic memory structures, and more particularly, to resistive memory structures, such as, for example and without limitation, resistive crossbar memory structures.

BACKGROUND

In order to overcome the pressing limitations of CMOS scaling in logic and memory applications, many alternative nanotechnologies have been proposed. Research in such alternative technologies has revealed that resistive memory elements, referred to herein as "memristors," have various digital and analog applications in, for example, ultra-dense crossbar memories, configurable logic applications, and as synaptic connections in neuromorphic architecture. For purposes of illustration and clarity, the description below will be with respect to resistive memory elements in the form memristors. It will be appreciated by those having ordinary skill in the art, however, that the present disclosure is not meant to be limited to the use of such elements or devices, but rather any number of suitable resistive memory elements may be used and remain within the spirit and scope of the present disclosure.

A memristor may be comprised of a $TiO_2$ thin film having two layers where the total resistance of the memristor is the sum of the resistances of the two layers. In an exemplary embodiment, one layer of the film has a high concentration of dopants and the other layer has a low (zero or virtually zero) concentration of dopants. The resistance of the memristor can be expressed and determined as set forth in equation (1):

$$R = \frac{w}{D} R_{ON} + \left(1 - \frac{w}{D}\right) R_{OFF} \quad (1)$$

where w is the width of the doped region, D is the total length of the thin film, $R_{ON}$ is the lowest resistance when w=D, and $R_{OFF}$ is the highest resistance when w=0. The rate of change of w with time $$\left(i.e., \frac{dw(t)}{dt}\right)$$

is represented as shown in equation (2):

$$\frac{dw(t)}{dt} = \mu_v \frac{R_{ON}}{D} i(t) \quad (2)$$

where $\mu_v$ is the dopant mobility and i(t) is the current passing through the memristor.

Memristors have been proposed to be used as non-volatile memory elements due to the fact that they retain their logical or resistive state even when they are un-powered. The resistive state of such devices indicates the data stored. For example, a memristor may store one bit of information or data where the low resistive state of the device can be represented as a logic "0" and the high resistive state can be represented as a logic "1." Since the resistance change in these devices or elements follows a continuous path, more than one bit of data can be stored in a single memristor when the data is encoded as distinct resistive states.

In practice, memristors have been used in memory applications with or without series active devices such as, for example, diodes and transistors, which provide isolation during read or write operations. This difference mainly depends on the current characteristics of the particular memristive device or element used. A memristor with highly nonlinear characteristics may not need such extra devices for isolation.

The possibility of using memristors as parts of non-volatile memory cells has led to the development of read and write circuitries for memory structures, such as, for example, ultra-dense crossbar memory structures. In general terms, and as is known in the art, a crossbar memory structure includes a first array of parallel conductors (e.g., nanowires) (hereinafter referred to as "rows") and a second array of parallel conductors (e.g., nanowires) (hereinafter referred to as "columns"), wherein the rows and columns are orientated at an angle with each other. The crossbar memory structure may further comprise a plurality of resistive memory elements (i.e., memristors), each one of which is respectively disposed between (i.e., at the intersection of) a single row and a single column of the crossbar memory structure. In each instance, the combination of the memristor and the conductors or wires of the corresponding row and column serves to form a resistive memory cell. Accordingly, a crossbar memory structure that includes a plurality of memristors disposed at respective intersections of the columns and rows of the crossbar memory structure comprises a plurality of resistive memory cells, each of which is disposed between a different row-column combination.

In crossbar memory structures such as that briefly described above, a single memory cell may be selected when the row and column of the crossbar memory structure corresponding thereto is selected. To select a row, a read, write, or erase voltage is applied to that particular row; and to select a column, a read, write, or erase voltage that is different than the voltage applied to the row is applied to that particular column. These voltages will be hereinafter referred to as "selection voltages." Unselected rows and columns of the crossbar memory structure are biased with an "unselect voltage," which is different than the selection voltages applied to the desired row and column.

Figure 1A:
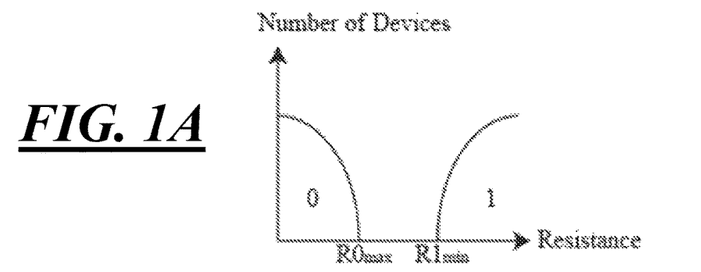
FIG. 1A depicts an example of a resistive state encoding scheme used to represent a single bit of data stored in a resistive memory cell.
Figure 1B:
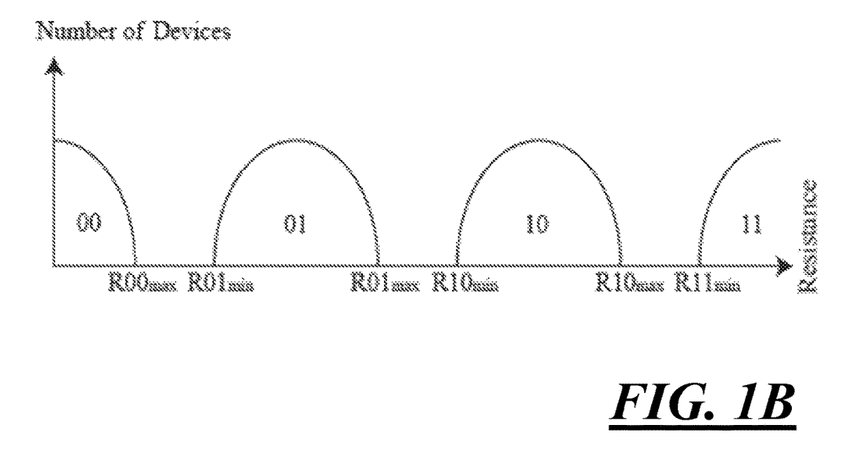
FIG. 1B. depicts an example of a resistive state encoding scheme used to represent two (2) bits of data stored in a resistive memory cell.

With respect to the reading of the data stored in a memory cell, and the memristor thereof, in particular, most conventional methodologies use the same resistive state encoding to represent stored data. Examples of encodings for memory cells storing a single bit and two bits of data are illustrated in FIGS. 1A and 1B, respectively. One drawback of conventional crossbar memory structures is that read methodologies corresponding thereto typically include the use of multiple comparators to compare the resistivity of the selected memory cell against multiple reference resistors to determine the current state. Generally speaking, two comparisons are required for each possible state that the memory cell may assume to determine if the resistance of the memristor is in that particular state. More particularly, for each potential state, one comparison is required to determine if the resistance of the memristor is equal to or greater than the lower bound for the reference state, and a second comparison is required to determine if the resistance is equal to or less than the upper bound for that state. For example, in an instance wherein there is a single bit of stored data, the resistance of the memristor typically has to be compared to the lower bound of the "0" state, the upper bound of the "0"

state, the lower bound of the "1" state, and the upper bound of the "1" state. Accordingly, for a memristor storing a single bit of data, four (4) comparisons are generally required. In an instance where a memristor stores two bits of data (as opposed to a single bit), the number of required comparisons doubles to eight (8), as the resistance of the memristor has to be compared to: the lower and upper bounds of the "00" state; the lower and upper bounds of the "01" state; the lower and upper bounds of the "10" state; and the lower and upper bounds of the "11" state. Accordingly, in order to determine the exact state for an n-bit memristor cell, theoretically $2^{(n+1)}$ comparisons are needed since the current state of the memristor needs to be compared against the upper and lower bounds of all possible states; in practice, however, the actual number of required comparisons can be reduced to $2^{(n+1)}-2$ by omitting comparisons for the lower bound of the lowest state and the upper bound of the highest state. It will be appreciated that these comparisons may be omitted because these bounds represent the limits of the memristor. Accordingly, for a single n-bit memristor of a conventional crossbar memory structure, $2^{(n+1)}-2$ comparators and $2^{(n+1)}-2$ reference resistors (or sources) are needed to determine the exact state of the memristor in one cycle, which adds complexity and cost to the crossbar memory structure.

In addition to the drawbacks described above, further drawbacks of conventional crossbar memory structures relate to the effects of memory state dependence and parasitic resistances to which memory cells (memristors) thereof may be exposed. Memory state dependence may be a problem due to the fact that the leakage current through unselected memory cells in the crossbar memory structure may affect the value read when the total leakage current exceeds a certain magnitude. Parasitic resistances can result in different resistive values being stored in the cells for the same logical value.

Accordingly, there is a need for crossbar memory structures and/or components thereof that minimize and/or eliminate one or more of the above-identified deficiencies.

SUMMARY

According to one embodiment, there is provided a resistive memory structure comprising at least one resistive memory element configured to store one or more bits of data, and a circuit electrically connected to the resistive memory element for use in performing at least one of a read or write operation on the at least one resistive memory element. The circuit includes a resistor electrically connected in series to the resistive memory element thereby forming a voltage divider and electrical node therebetween, and an interpretation circuit electrically connected to the electrical node formed between the resistive memory element and the serially connected resistor. The interpretation circuit is configured to interpret a voltage at the electrical node and to determine a resistive state of the resistive memory element based on the voltage at the electrical node.

In accordance with another embodiment, there is provided a circuit for use in performing at least one of a read or write operation on a resistive memory element, the circuit comprising an electrical node configured for electrical connection to the resistive memory element, a resistor electrically connected to the electrical node, and an interpretation circuit also electrically connected to the node. The interpretation circuit is configured to interpret a voltage at the electrical node and to determine a resistive state of the resistive memory element based on the voltage at the electrical node.

Accordingly, yet another embodiment, there is provided a method of perform a read or write operation on a resistive memory element serially connected to a resistor to form a voltage divider and electrical node therebetween. The method comprises applying one or more selection voltages to the resistive memory element, interpreting, by an interpretation circuit, a voltage at the electrical node between the resistive memory element and the resistor, and determining a resistive state of the resistive memory element based on the voltage at the electrical node.

BRIEF DESCRIPTION OF THE DRAWINGS

One or more embodiments of the invention will hereinafter be described in conjunction with the appended drawings, wherein like designations denote like elements, and wherein.

DETAILED DESCRIPTION

In an embodiment, a resistive memory structure comprises a plurality of resistive memory cells that each includes a corresponding memristor. Each resistive memory cell, and the memristor thereof, in particular, is configured to store one or multiple bits of data. For purposes of illustration, the description below will be primarily with respect to a resistive memory structure in the form of a crossbar memory structure having a plurality of resistive memory cells. It will be appreciated by those having ordinary skill in the art, however, that the present disclosure is not meant to be limited to crossbar memory structures, but rather, the resistive memory structure of the present disclosure may find application in any number of other types of resistive memory structures or devices, each of which remains within the spirit and scope of the present disclosure. Additionally, while the description below will be with respect to the memory cells being configured to store one (1) or two (2) bits of data, it will be appreciated that in other embodiments, the memory cells, and the memristors thereof, in particular, may be configured to store any number of bits of data, and thus, the present disclosure is not meant to be limited to any particular memristor storage capacity or capability.

Figure 2:
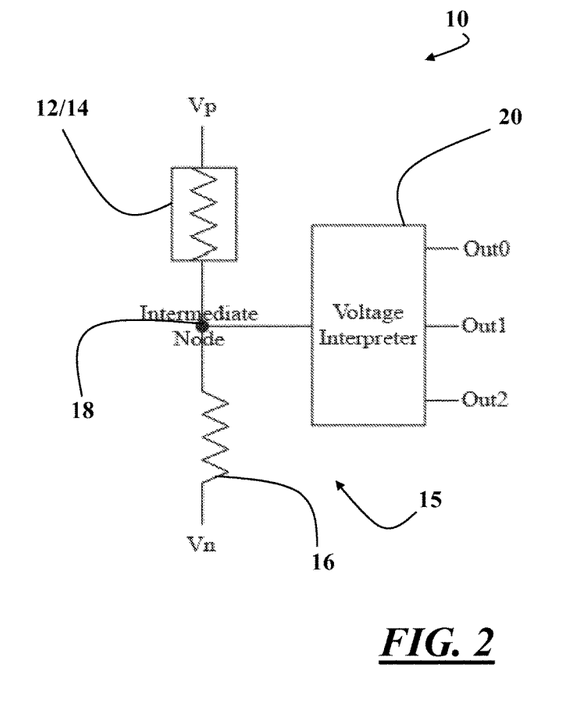
FIG. 2 is a schematic and diagrammatic illustration of at least a portion of an embodiment of a resistive memory structure.

With reference FIG. 1, in an embodiment, a resistive memory structure 10 may include a resistive memory cell 12 and a circuit 15 that may be used, for example, in the performance of read, write, and/or erase operations performed on the resistive memory cell 12. In an embodiment, the memory cell 12 comprises a memristor 14 that is configured to store one or multiple bits of data, while the circuit 15 comprises a resistor 16 configured to be electrically connected in circuit to the memristor 14 of the memory cell 12 to form an electrical node 18 (or "intermediate node 18") therebetween, and an interpretation circuit 20 configured to be electrically connected to the electrical node 18.

Figure 10:
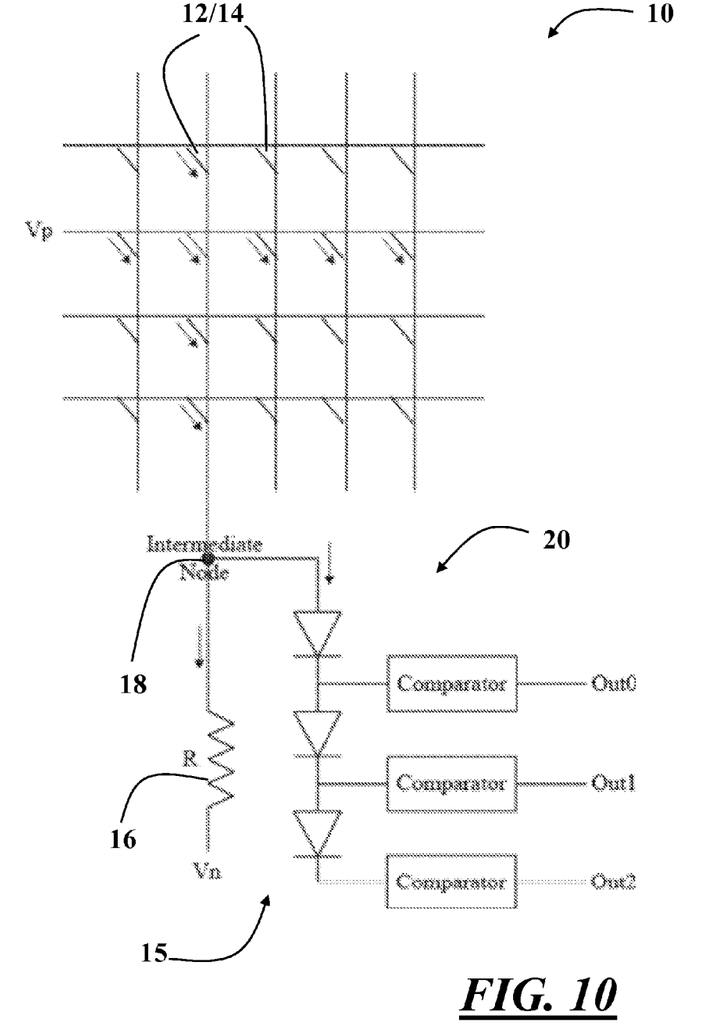
FIG. 10 is a schematic and diagrammatic illustration of a resistive crossbar memory structure illustrating, for example, current paths created when selection voltages are applied to a particular row and column.

In an embodiment, each memory cell 12 of the resistive memory structure 10 has a dedicated circuit 15 corresponding thereto. Alternatively, some or all of the cells 12 may be configured to share a circuit 15. For example, and as best shown in FIG. 10, in one implementation where the resistive memory structure 10 comprises a crossbar memory structure, the memory cells 12 in each column may share a circuit 15 (i.e., resistor 16, node 18, and interpretation circuit 20). In another implementation, one circuit 15 may be used in conjunction with a multiplexer (not shown) to allow every memory cell 12 of the resistive memory structure 10 to share the circuit 15. Thus, the present disclosure is not meant to be limited to any particular implementation of the circuit structure and methodologies described herein. Accordingly, while the description below will be primarily with respect to the arrangement depicted in FIG. 1 of a single memory cell 12 being electrically connected to the circuit 15, the present disclosure is not limited to such an arrangement.

With continued reference to FIG. 2, in an embodiment, the resistor 16 of the circuit 15 is electrically connected in series to the memristor 14, thereby forming a voltage divider between the memristor 14 and resistor 16. The electrical connection between the resistor 16 and memristor 14 may be a direct connection (i.e., the resistor 16 may be directly connected to the memristor 14) or, alternatively, the connection may be indirect (i.e., the resistor 16 may be connected to the memristor 14 via or through one or more additional components or circuit elements). For example, in an embodiment, the resistor 16 may be connected to the memristor 14 via a column decoder (not shown). In any event, by virtue of the aforementioned voltage divider configuration, the node 18 will have a unique voltage value depending on the resistive state of the memristor 14 and the resistance of the corresponding resistor 16 when one or more constant selection voltages are applied to the memristor 14. The number of resistive states that the memristor 14 may have is dependent upon the number of bits it is configured to store. For example, in an embodiment wherein the memristor 14 is configured to store a single bit, the memristor 14 may have two (2) different resistive states—one (e.g., low resistive state) for a logic "0," and one (e.g., high resistive state) for a logic "1." Similarly, if the memristor 14 is configured to store two (2) bits of data, the memristor 14 may have four (4) different resistive states, one for each of the logic states "00," "01," "10," and "11."

The uniqueness of the voltage at the electrical node or intermediate node 18 (referred to below as the "intermediate node voltage") allows for the use of the interpretation circuit 20 to determine the exact resistive state of the corresponding memristor 14, and therefore, read the data stored in the memristor 14 and represented by the resistive state thereof. The interpretation circuit 20 can include complex circuitry to implement various node voltage interpretation techniques, or may, as will be described below, include a relatively simple and efficient technique and circuit.

For example, in an embodiment such as that illustrated in FIG. 2, the interpretation circuit 20 may include one or more comparators 22. The comparators 22 may be used to compare the intermediate node voltage against the voltages of a number of reference voltage sources (e.g., two or more sources) to determine the resistive state of the memory cell 12, and the memristor 14 thereof, in particular. Alternatively, in an embodiment such as that illustrated in FIG. 3, the interpretation circuit 20 may include active devices 24 (e.g., diodes 24), that may be utilized to generate or provide voltage thresholds which, in turn, can be used to interpret the intermediate node voltage, and therefore, determine the resistive state of the memristor 14. In such an embodiment, the active devices 24 can be electrically connected serially, in parallel, or a combination of both, to generate or provide different threshold levels.

As was described elsewhere above, in an instance where the memristor 14 of a memory cell 12 is configured to store two (2) bits of data, there are four (4) resistive states that encode the bits stored in the memristor 14 (i.e., "00," "01," "10," and "11"). For each of these four (4) unique states, four (4) different voltage levels are generated at the intermediate node 18. In an embodiment such as that illustrated in FIG. 3 wherein the interpretation circuit 20 includes and utilizes serially connected diodes 24, three (3) such diodes 24 (i.e., diodes $24_0$-$24_2$) are needed to distinguish between these four different voltage levels. More particularly, in an embodiment, the outputs of the three diodes $24_0$-$24_2$ are electrically connected to respective comparators 22 (i.e., comparators $22_0$-$22_2$) to determine if the voltage level at the intermediate node 18 has reached a certain threshold voltage.

In an embodiment, the resistance value of the series resistor 16 and the selection voltage used to select the memristor 14 (i.e., the row and column voltages—$V_p$ and $V_n$, respectively—used to select the memristor 14) are picked such that if the resistive state of the memristor 14 is "00," the memristor 14 is at the lowest resistance, and therefore, the intermediate voltage is at least three (3) diode thresholds above the bias voltage. This leads, in an exemplary embodiment, to the outputs of each comparator 22 ($Out_0$-$Out_2$ in FIG. 3), being logic high (i.e., "1"). Accordingly, in such an embodiment, the output signals of the comparators 22 are "high" when the input signals from the diodes do not match, and "low" (i.e., "0") when the signals do match. In view of the above, it follows, then, that when the state of the memristor 14 is "01," the intermediate node voltage is at least two (2) diode thresholds above the bias level, but less than three (3) diode thresholds above the bias level, as is the case when the state is "00." As such, this leads to the comparator output signals $Out_0$ and $Out_1$ being "high," and output signal $Out_2$ being "low." When taken to its natural conclusion, in such an embodiment, when the state of the memristor 14 is "10," the comparator output signal $Out_0$ is "high" and the rest are "low;" while when the state of the memristor 14 is "11," all of the comparator outputs $Out_0$-$Out_2$ are "low." It will be appreciated that while in the embodiment described above, the comparator output signals are "high" when the input signals from the diodes do not match, and "low" when they do, the opposite may be true in alternate implementations. Accordingly, in another exemplary embodiment, the comparator output signals are "low" when the signals do not match, and "high" when they do. Accordingly, the present disclosure is not meant to be limited to any one particular logic scheme.

Figure 3:
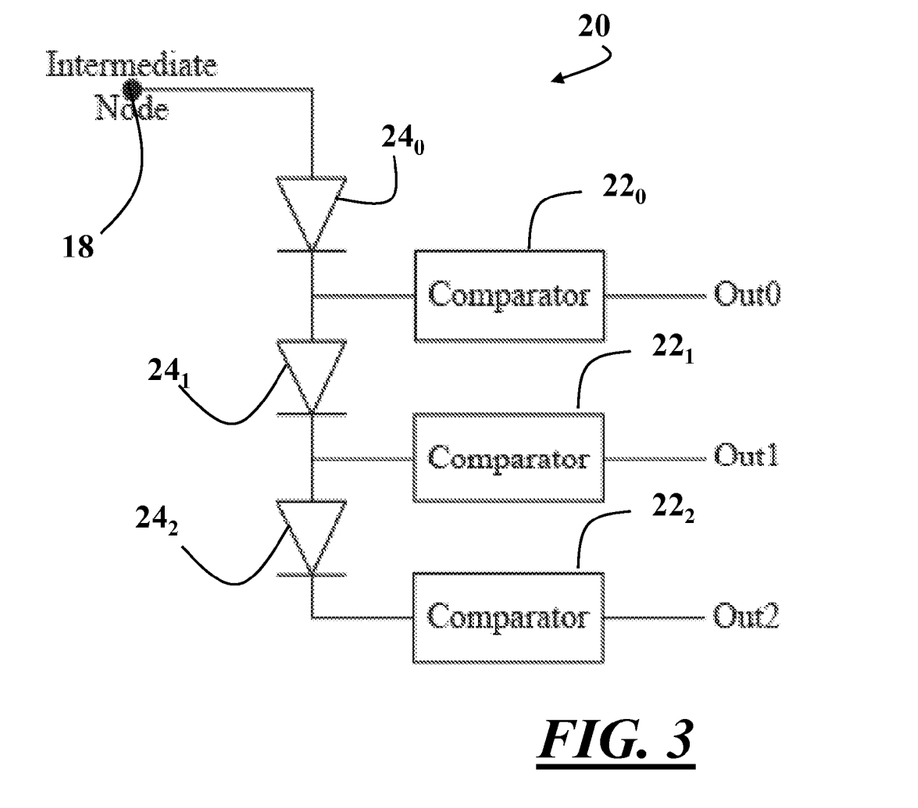
FIG. 3 is a schematic and diagrammatic illustration of an embodiment of a interpretation circuit of the resistive memory structure illustrated in FIG. 2.

In any event, the "encoded" comparator output signals $Out_0$-$Out_2$ may be used as control signals during, for example, write and erase operations of or performed on the memory cells 12 (e.g., memristors 14) of the memory structure 10. Further, the structure and methodology described above may enable the simultaneous observation of the change of resistance in the selected memristor 14 while selection voltages are applied.

It will be appreciated by those having ordinary skill in the art that the thresholds of the diodes 24 determine the density of the resistive states of a given memristor 14. For instance, if the thresholds are lower, the density increases meaning the resistance values for different states get closer. Additionally, in an exemplary embodiment wherein the interpretation circuit 20 used to interpret the intermediate node voltage comprises a plurality of diodes 24 connected in parallel, as opposed to a plurality of serially-connected diodes 24 as is illustrated in FIG. 3, three (3) different thresholds would be needed for a memristor configured to store two bits of data.

Additionally, the particular number of thresholds and comparators 22 that are needed for the interpretation circuit 20 is dependent upon the number of bits stored in the corresponding memristor 14 (or the number of bits the memristor 14 is configured to store). More particularly, for multi-bit memristor 14 storing, or being configured to store, "n" bits of data, $2^n-1$ unique thresholds and comparators 22 are needed. If the threshold generating devices are diodes, then $2^n-1$ diodes are also needed. For example, in an embodiment such as that described above and illustrated in FIG. 3 wherein the memristor 14 is configured to store two (2) bits of data, the interpretation circuit 20 needs three (3) diodes 24 (and corresponding thresholds) and three (3) comparators 22 (i.e., $2^2-1=3$). As explained above, certain conventional structures/methods require the use of $2^{(n+1)}-2$ comparators and reference resistors. Accordingly, for a memristor storing two (2) bits of data, six (6) comparators and reference resistors are required. As such, the structure and method described herein reduces the number of comparators needed by half (3 vs. 6).

As briefly described above, the circuit 15 may be used for performing read, write, and/or erase operations on one or more memory cells 12 of the memory structure 10, and the memristor 14 thereof, in particular. In an embodiment, and with reference to FIG. 2, during a write operation of or performed on the memristor 14, write voltages are applied to the selected row ($V_p$) directly and selected column ($V_n$) through the series resistor and certain column selection circuitry. If the state "11" is to be written to the memristor 14, and assuming the memristor 14 is erased to the "00" state before programming, the intermediate node voltage would start to increase with the application of write voltages $V_p$ and $V_n$, and the comparator output signals $Out_0$-$Out_2$ start to go "low" one by one. The application of write voltages stops when $Out_0$, which is the last comparator output to go "low," becomes "low." The controller works similarly for the other states.

Figure 4:
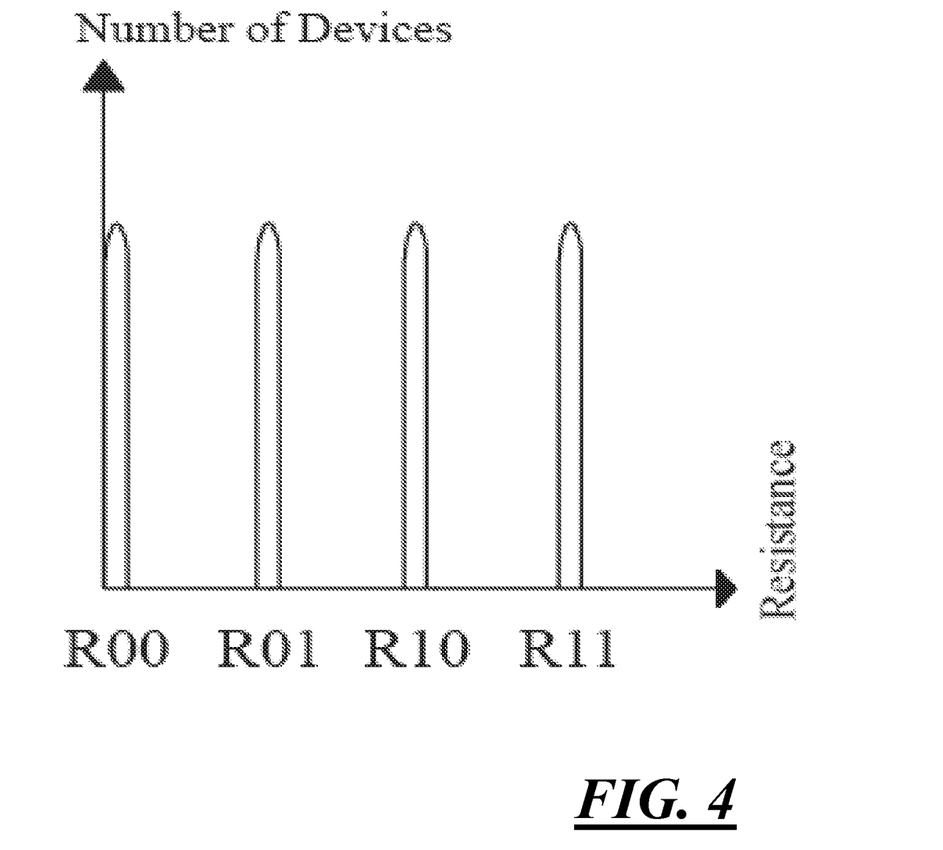
FIG. 4 is a graphical representation of an example of an expected resistance distribution for a resistive memory cell of the resistive memory structure illustrated in FIG. 2.

As was briefly described above, unique intermediate node voltages translate as unique resistance values for corresponding memristors 14. The use of outputs of interpretation circuit 20 as control signals for the write operation will result in exact resistances to be programmed to the memristors 14. This leads to the narrowing of the resistance distributions for each state of the memristor 14 (See, for example, FIG. 4). However, it will be appreciated that exact distributions and states depend on the implementation of, for example, write and/or erase operations, as well as characteristics of the device(s) used.

Figure 5:
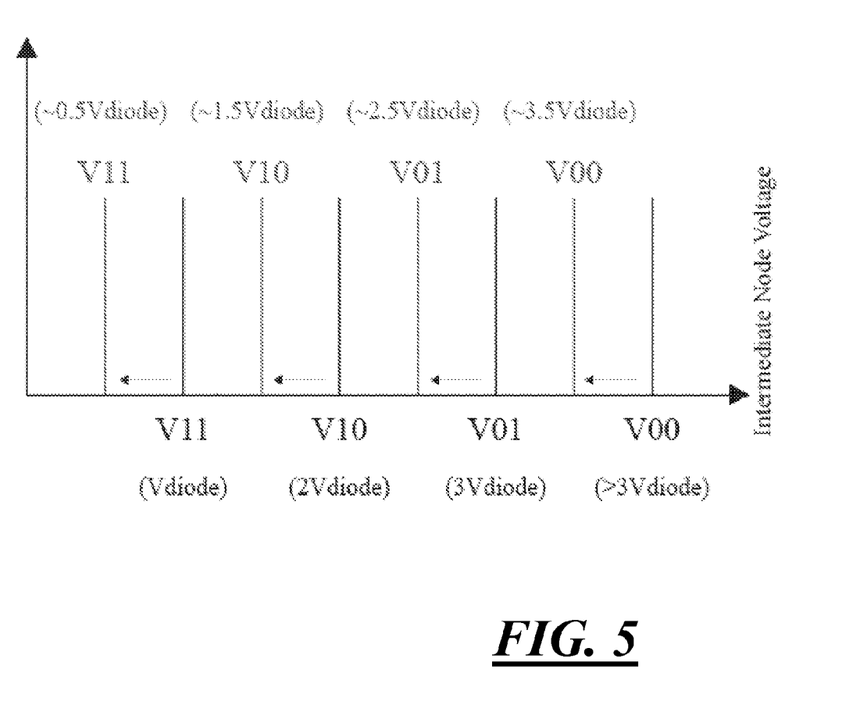
FIG. 5 is a graphical representation of examples of voltage levels for read and write operations performed on a resistive memory cell of the resistive memory structure illustrated in FIG. 2.

During a read operation, selection voltages having the same or lower amplitude than the write voltages described above may be used. If lower amplitude voltages are used, the amplitude may be picked such that the intermediate node voltage does not shift more than a diode threshold for the intermediate resistive states. Further, the duration of the application of read voltages should be kept low in order to avoid altering the resistive state of the memristor 14 being read. For purposes of illustration, FIG. 5 shows examples of voltage levels for read and write operations. More specifically, FIG. 5 illustrates an example of a shift in the intermediate node voltage when lower read voltages are applied. For each state V11, V10, V01, and V00, the line to the right indicates the voltage at the completion of a write operation, and the line to the left indicates the voltage during a read operation. Using a lower voltage level during read operations is advantageous since it offsets the intermediate node voltages from threshold levels representing each state, and reduces the current passing through the selected memristor 14, thus lowering the effect of the operation on resistance change.

Validation testing utilizing a known simulated memristor model was conducted for the circuit structure and methodologies described above. It will be appreciated that while this testing was conducted with only the aforementioned known memresistor model, the circuit structure and methodologies described herein are compatible with any memristor model as long as the resistance of the memristor can be altered when it is biased with a source. Further, it will be appreciated that while the tested circuit structure included certain numbers and types of components (e.g., certain number of diodes and/or comparators, a series resistor having a particular value, etc.), and certain testing/operational parameters were utilized (e.g., certain read and write voltage ranges, pulse durations, etc.), the present disclosure is not meant to be limited to a particular composition of the tested circuit structure, nor the testing/operational parameters used during such validation testing.

Figure 6:
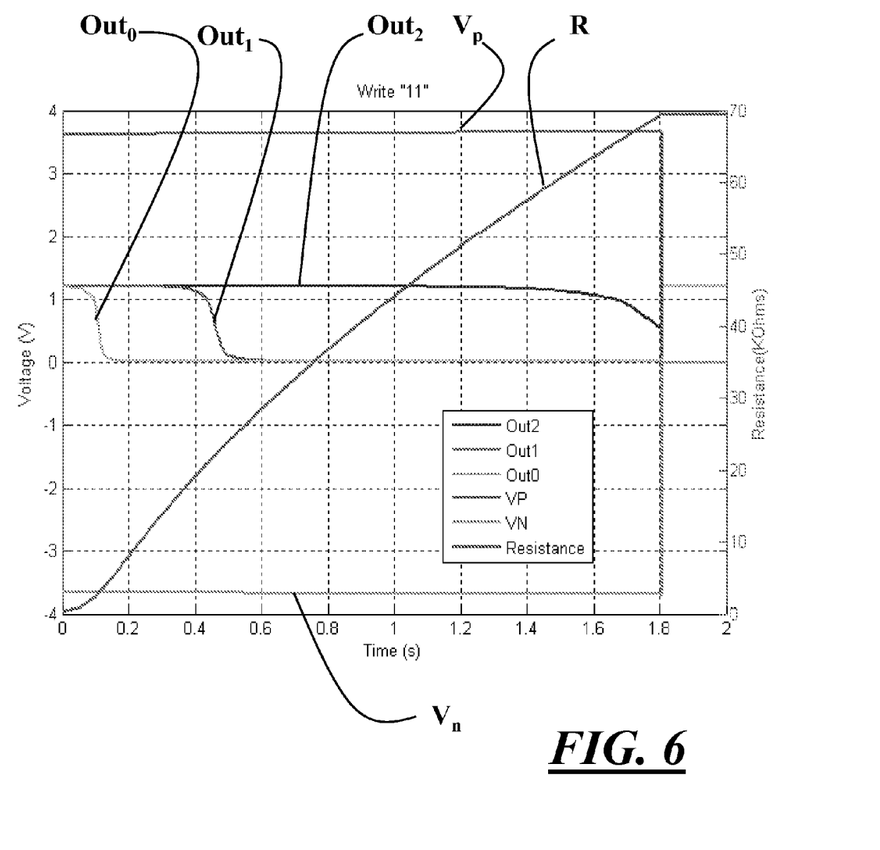
FIGS. 6-8 are graphical representations illustrating examples of the operation of the resistive memory structure illustrated in FIG. 2, and the interpretation circuit thereof, in particular, during the performance of different write operations performed on a resistive memory cell of the memory structure.
Figure 7:
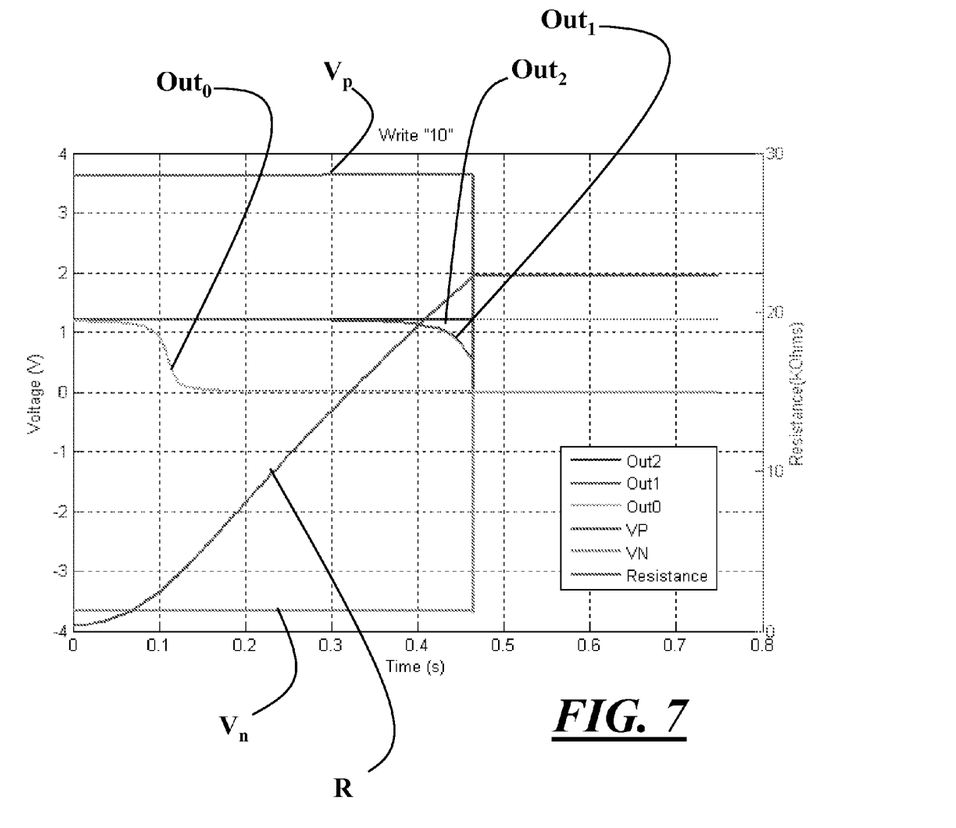
Figure 8:
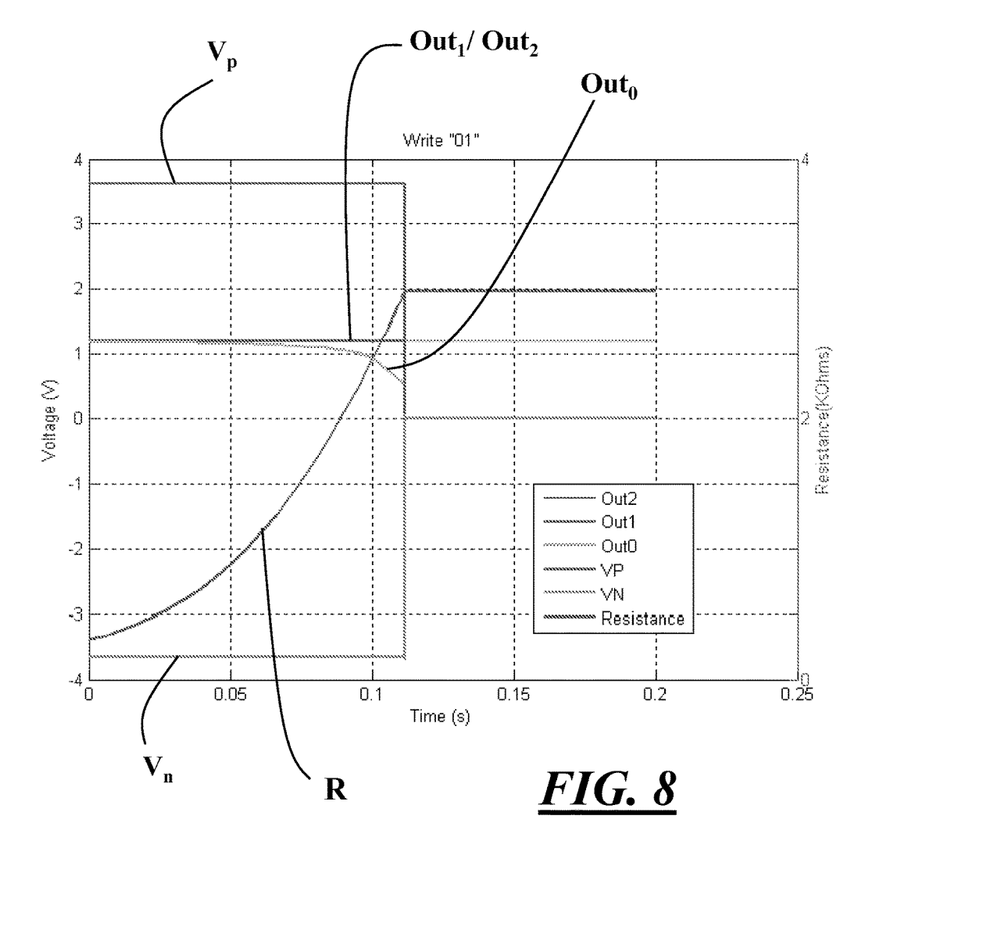

FIGS. 6-8 illustrate the operation of the circuit structure during write operations performed during the aforementioned validation testing. For example, in FIG. 6, a state "11" is written to the memristor or memory cell, and the output signals of the comparators of the interpretation circuit start to go "low" as the resistance of the memristor increases. When the output signal $Out_0$ reaches the switching threshold for CMOS, the application of write voltages stops and the comparator output signals $Out_0$-$Out_2$ go back to a "high" state. The performance during the writing of states "10" and "01" are illustrated in FIGS. 7 and 8, respectively.

Figure 9:
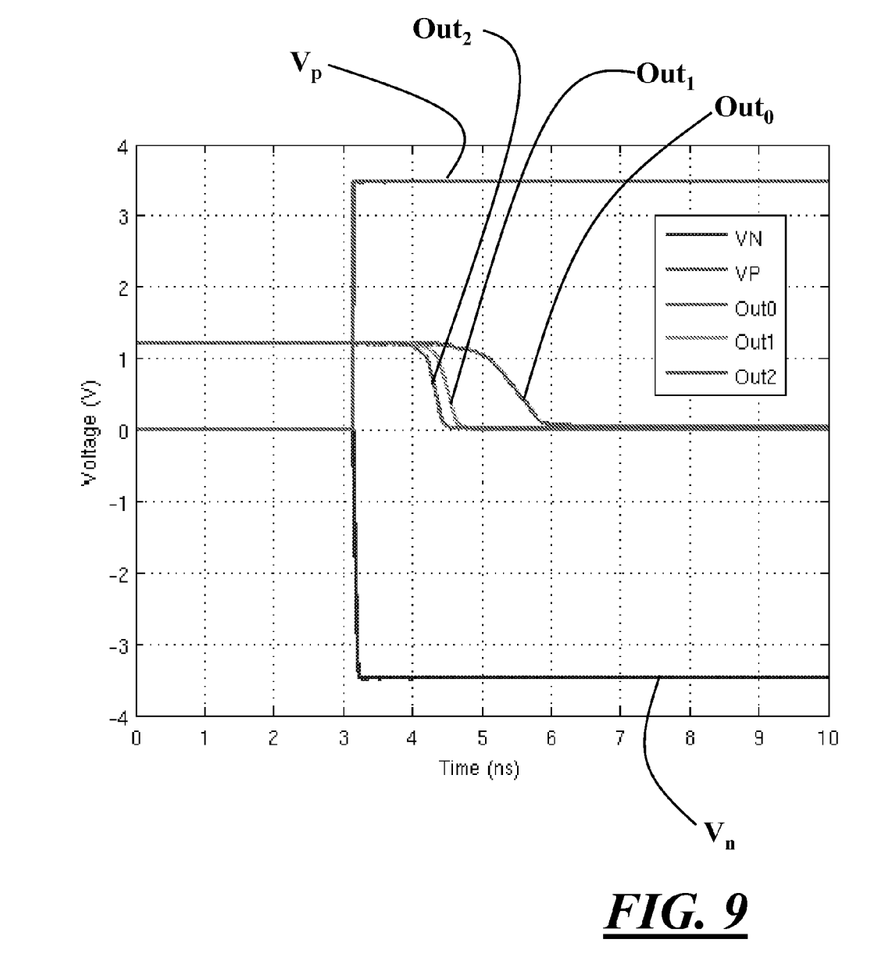
FIG. 9 is a graphical representation illustrating an example of the operation of the resistive memory structure illustrated in FIG. 2, and the interpretation circuit thereof, in particular, during a read operation performed on a resistive memory cell of the memory structure.

FIG. 9 illustrates the operation of the circuit structure during read operations performed during the validation testing described above. More particularly, during the read operation, a pulse of limited duration (100 ns) was used in order to avoid changing the resistive state of the memristor. Testing determined that a state written to the memristor can be reliably read using a lower voltage. As illustrated in FIG. 9, during the read operation, all output signals of the comparator $Out_0$-$Out_2$ go "low" indicating the stored value to be "11."

In conventional crossbar memory structures, leakage current through neighboring memory cells 12 can interfere with the current sensed through the selected memory cell 12. As a result, the array size of the crossbar memory structure may be limited. However, the circuit structure and methodologies of the present disclosure provide high resistance to the memory state dependent leakage.

In the circuit structure and methodologies of the present disclosure, memory state dependent leakage interference can theoretically cause a shift in the intermediate voltage; therefore if the memory state at which the selected memristor 14 is written is different than the state at which the selected memristor 14 is read, the interference can cause a wrong value to be read.

If Kirchhoff's current law is applied to the intermediate node, we get the following equation (3):

$$I_R + I_{Diode} = I_{Cell} + (N-1) * I_{LeakC} \quad (3)$$

where $I_R$ is the current through the series resistor, $I_{Diode}$ is the current going into the interpretation circuit 20, $I_{Cell}$ is the current through the selected memristor 14, and $I_{LeakC}$ is the leakage current through a single unselected memristor 14 connected to the selected column.

As can be seen in FIG. 10, only leakage through the memristors 14 that are connected to the same column as the selected memristor 14 are contributing to the total current going into the intermediate node, therefore the total leakage current is $(N-1)*I_{LeakC}$ where N is the number of cells 12 connected to a column. A simplification can be made to equation (3) by ignoring the current through the interpretation circuit 20 because the diode outputs are connected to high impedance, and thus, equation (3) may become equation (4):

$$I_R = I_{Cell} + (N-1) * I_{LeakC} \quad (4)$$

Using equation (5), Kirchhoff's voltage law may be used to obtain expressions for the currents in (4):

$$\frac{V_{int} - V_N}{R} = \frac{V_P - V_{int}}{M_{Cell}} + (N-1) * I_{LeakC} \quad (5)$$

where $V_{int}$ is the intermediate node voltage and $M_{Cell}$ is the resistance of the selected memristor 14. Solving for $V_{int}$ using equation (6):

$$V_{int} = \frac{R * V_P + M_{Cell} * V_N}{R + M_{Cell}} + \frac{R * M_{Cell}}{R + M_{Cell}} * (N-1) * I_{LeakC} \quad (6)$$

In an exemplary embodiment wherein the interpretation circuit 20 comprises serially connected diodes 24, the first part will result in, for example, voltages between 0.7 and 2.1 volts for typical diodes. The resistive component of the second part results in a value between R and $M_{Cell}$ which is device dependent and can be in the KΩ to MΩ range. The typical leakage current for a CMOS diode is around $10^{-19}$ A for 130 nm technology. Even with an array size of 256×256 memory cells 12, the contribution of the second part to the intermediate node voltage is extremely low, and $V_{int}$ is determined by the first part.

Further, in conventional crossbar memory structures, parasitic resistances can result in different resistive values being stored in memory cells 12 for the same logical value. In the circuit structure of the present disclosure, the effective memory cell resistance seen by the interpretation circuit 20 includes the resistance of the memory cell 12, the resistance of the crossbar wires, and the effective resistance of the selection circuitry. The contribution of the resistance of the crossbar conductors or wires of the corresponding column and row of the crossbar memory structure 10 to the total resistance seen by the intermediate node depends on the position of the memory cell 12 being selected. The total resistance will be the same for all of the memory cells 12 for the same state because a unique voltage at the intermediate node 18 corresponds to a unique total resistance. Therefore, the circuit structure is self-compensatory to the variations in the parasitic series resistance.

Accordingly, in view of the above, the circuit structure and methodologies of the present disclosure enable storage of multiple bits of data in a single memory cell of a resistive memory structure, such as, for example, a crossbar memory structure, thereby enabling ultra-dense, non-volatile memristor memory structures, while also eliminating the use of reference resistors and reducing the number of comparisons required, and therefore, the comparators needed, as compared to conventional methodologies and techniques.

It is to be understood that the foregoing description is of one or more embodiments of the invention. The invention is not limited to the particular embodiment(s) disclosed herein, but rather is defined solely by the claims below. Furthermore, the statements contained in the foregoing description relate to the disclosed embodiment(s) and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A resistive memory structure, comprising:
   at least one resistive memory element configured to store one or more bits of data; and
   a circuit electrically connected to the resistive memory element for use in performing at least one of a read or write operation on the at least one resistive memory element, the circuit including:
   a resistor electrically connected in series to the resistive memory element thereby forming a voltage divider and electrical node therebetween; and
   an interpretation circuit electrically connected to the electrical node formed between the resistive memory element and the serially connected resistor, and configured to interpret the voltage at the electrical node, wherein the interpretation circuit comprises
   one or more active devices each configured to generate a threshold voltage derived from a voltage at the electrical node that is less than the voltage at the electrical node, and
   one or more comparators each configured to compare a reference voltage with the voltage threshold generated by a corresponding active device that is less than the voltage at the electrical node, wherein the interpretation circuit is configured to determine a resistive state of the resistive memory element based on the comparison(s) of the reference voltage with the threshold voltage(s) that are less than the voltage at the electrical node.

2. The resistive memory structure of claim 1, wherein the resistive memory structure comprises a crossbar memory structure having a plurality of resistive memory elements, and wherein the circuit is electrically connected in series to each resistive memory element in a given column of the crossbar memory structure.

3. The resistive memory structure of claim 1, wherein the interpretation circuit comprises $2^n-1$ comparators, where n is the number of bits of data the resistive memory element is configured to store.

4. The resistive memory structure of claim 1, wherein the interpretation circuit comprises $2^n-1$ active devices, where n is number of bits of data the resistive memory structure is configured to store.

5. The resistive memory structure of claim 1, wherein the one or more active devices comprise one or more diodes.

6. The resistive memory structure of claim 1, wherein the one or more active devices comprise a plurality of serially connected active devices.

7. The resistive memory structure of claim 3, wherein n is greater than one bit and the interpretation circuit has more than one comparator.

8. The resistive memory structure of claim 4, wherein n is greater than one bit and the interpretation circuit has more than one active device.

9. The resistive memory structure of claim 1, wherein the interpretation circuit comprises a plurality of comparators each of which is configured to compare the same reference voltage to the voltage threshold generated by the active device corresponding thereto.

10. A circuit for use in performing read, write, and/or erase operations of a resistive memory element, comprising:
an electrical node configured for electrical connection to the resistive memory element;
a resistor electrically connected to the electrical node; and
an interpretation circuit electrically connected to the electrical node and configured to interpret the voltage at the electrical node, wherein the interpretation circuit comprises
one or more active devices each configured to generate a threshold voltage derived from a voltage at the electrical node that is less than the voltage at the electrical node, and
one or more comparators each configured to compare a reference voltage with the voltage threshold generated by a corresponding active device that is less than the voltage at the electrical node,
wherein the interpretation circuit is configured to determine a resistive state of the resistive memory element based on the comparison(s) of the reference voltage with the threshold voltage(s) that are less than the voltage at the electrical node.

11. The circuit of claim 10, wherein the interpretation circuit comprises $2^n-1$ comparators, where n is the number of bits of data the resistive memory element is configured to store.

12. The circuit of claim 10, wherein the interpretation circuit comprises $2^n-1$ active devices, where n is the number of bits of data the resistive memory element is configured to store.

13. The circuit of claim 10, wherein the one or more active devices comprise one or more diodes.

14. The circuit of claim 10, wherein the one or more active devices comprise a plurality of serially connected active devices.

15. The circuit of claim 11, wherein n is greater than one bit and the interpretation circuit has more than one comparator.

16. The circuit of claim 12, wherein n is greater than one bit and the interpretation circuit has more than one active device.

17. A method of performing a read or write operation on a resistive memory element serially connected to a resistor to form a voltage divider and electrical node therebetween, comprising:
applying at least one selection voltage to the resistive memory element;
interpreting, by an interpretation circuit, a voltage at the electrical node between the resistive memory element and the resistor, the interpreting step comprising comparing, by each of one or more comparators, a reference voltage with a threshold voltage derived from the voltage at the electrical node and generated by an active device corresponding to that comparator, wherein each generated threshold voltage is less than the voltage at the electrical node; and
determining a resistive state of the resistive memory element based on the comparison(s) of the reference voltage with the threshold voltage(s) that are less than the voltage at the electrical node.

18. The method of claim 17, wherein each of the one or more comparators compares the same reference voltage to the voltage threshold generated by the active device corresponding thereto.

19. The method of claim 17, wherein the method comprises performing a write operation on the resistive memory element, and the method further includes removing the at least one selection voltage from the resistive memory element when the resistive state of the resistive memory element determined in the determining step reaches a desired state.

20. The method of claim 17, wherein the interpreting step comprises determining, using $2^n-1$ comparators, whether the voltage threshold generated by a corresponding active device has reached the reference voltage where n is the number of bits of data the resistive memory element is configured to store.

21. The method of claim 17, wherein the applying step comprises simultaneously applying a first selection voltage and a second selection voltage that is different than the first selection voltage.

22. The method of claim 17, wherein the method comprises performing a write operation on the resistive memory element, and the at least one selection voltage applied in the applying step is greater than that applied during the performance of a read operation on the resistive memory element.

23. The method of claim 17, wherein the method comprises performing a read operation on the resistive memory element, and the at least one selection voltage applied in the applying step is less than that applied during the performance of a write operation on the resistive memory element.

24. The circuit of claim 10, wherein the interpretation circuit comprises a plurality of comparators each of which is configured to compare the same reference voltage threshold generated by the active device corresponding thereto.

* * * * *